(12) United States Patent
Landon, Jr. et al.

(10) Patent No.: US 9,585,240 B2
(45) Date of Patent: Feb. 28, 2017

(54) ADVANCED GROUNDING SCHEME

(71) Applicant: TriQuint Semiconductor, Inc., Hillsboro, OR (US)

(72) Inventors: Thomas R. Landon, Jr., Plano, TX (US); Paul D. Bantz, Los Altos, CA (US); Tarak A. Railkar, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 423 days.

(21) Appl. No.: 14/062,494

(22) Filed: Oct. 24, 2013

(65) Prior Publication Data
US 2015/0116947 A1 Apr. 30, 2015

(51) Int. Cl.
*H05K 1/16* (2006.01)
*H05K 1/02* (2006.01)
*H05K 3/46* (2006.01)

(52) U.S. Cl.
CPC ......... *H05K 1/0204* (2013.01); *H05K 1/0207* (2013.01); *H05K 1/0215* (2013.01); *H05K 1/0216* (2013.01); *H05K 3/4602* (2013.01); *H05K 2201/0187* (2013.01); *H05K 2201/10416* (2013.01); *H05K 2203/0191* (2013.01); *Y10T 29/49155* (2015.01)

(58) Field of Classification Search
CPC .............. H05K 1/0206; H05K 1/0204; H05K 2201/10416; H05K 1/112; H05K 1/113; H05K 1/116; H05K 2201/096
See application file for complete search history.

(56) References Cited

U.S. PATENT DOCUMENTS

| | | | | |
|---|---|---|---|---|
| 2005/0099762 A1* | 5/2005 | Wermer | ................ | H05K 1/115 361/500 |
| 2006/0272850 A1* | 12/2006 | Morimoto | ............ | H05K 3/4046 174/254 |
| 2006/0274510 A1* | 12/2006 | Nakada | ................ | H05K 3/4069 361/748 |
| 2007/0272435 A1* | 11/2007 | Johnson | ............... | H05K 1/0204 174/259 |
| 2008/0230258 A1* | 9/2008 | Shen | .................... | H05K 1/0218 174/251 |
| 2010/0003788 A1* | 1/2010 | Wang | .................. | H01L 23/3677 438/118 |
| 2010/0238635 A1* | 9/2010 | Yang | .................... | H05K 1/0243 361/748 |
| 2013/0269986 A1* | 10/2013 | Sun | ...................... | H05K 1/0204 174/252 |
| 2014/0144677 A1* | 5/2014 | Wang | .................. | H05K 1/0206 174/252 |

* cited by examiner

*Primary Examiner* — Steven T Sawyer
(74) *Attorney, Agent, or Firm* — Withrow & Terranova, P.L.L.C.

(57) ABSTRACT

A laminate substrate may include a slug positioned within a cavity of a laminate core. The laminate substrate may have routing layers on either side of the laminate core, at least one of which is coplanar with an outer side of the slug. A capping layer may then be applied to the laminate substrate which is directly coupled with the slug and the routing layer. In embodiments, a dielectric layer may be coupled with the capping layer, and an additional routing layer may be coupled with the dielectric layer. Therefore, the routing layer may be an "inner" routing layer that is coplanar with, and coupled with, the slug.

19 Claims, 15 Drawing Sheets

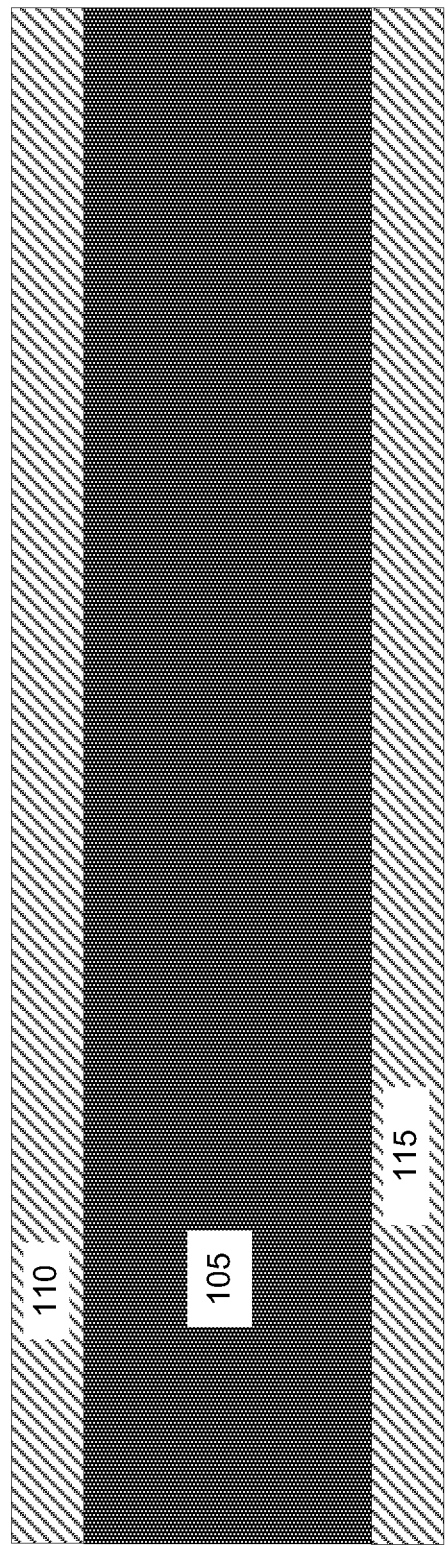
Figure 1-A

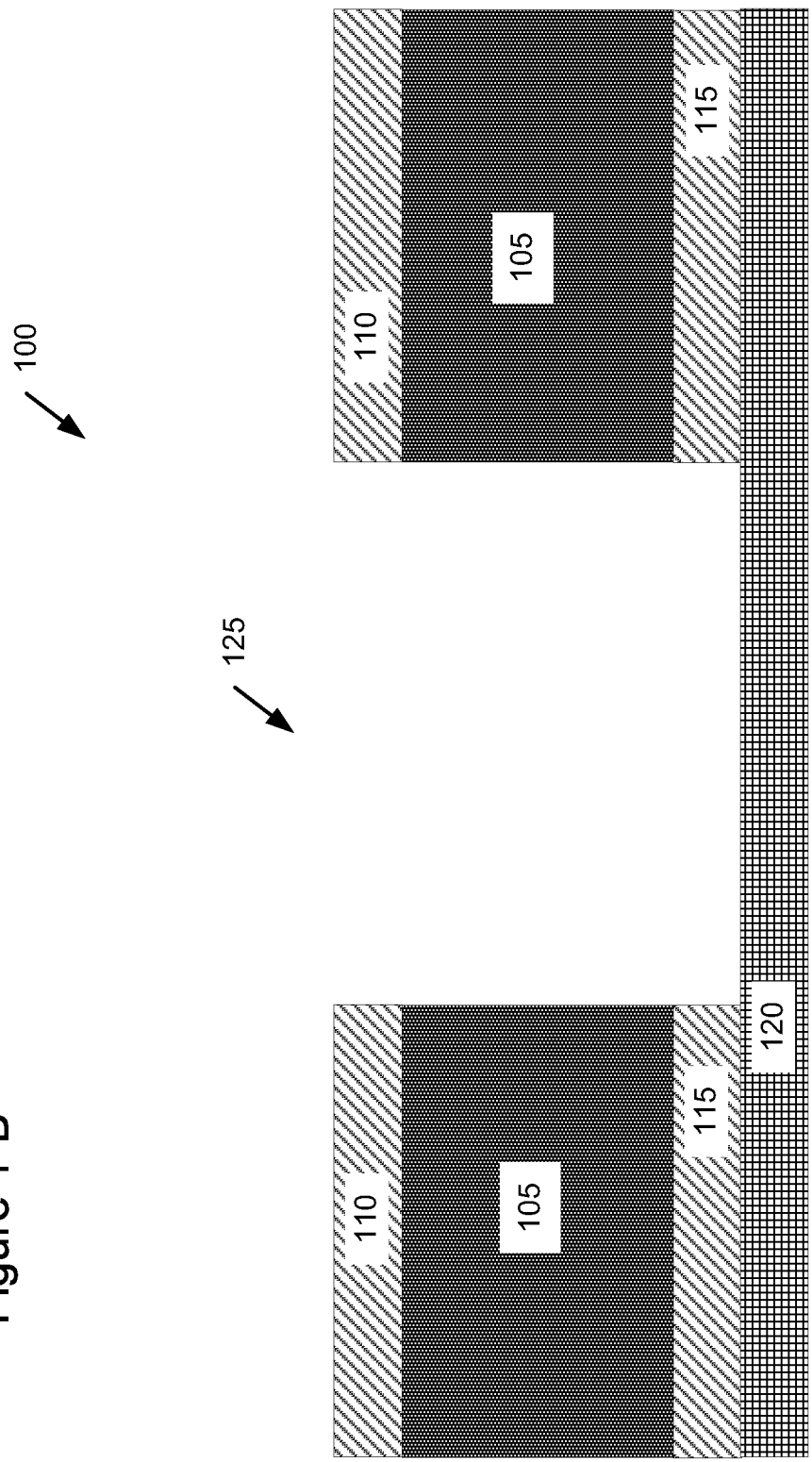
Figure 1-B

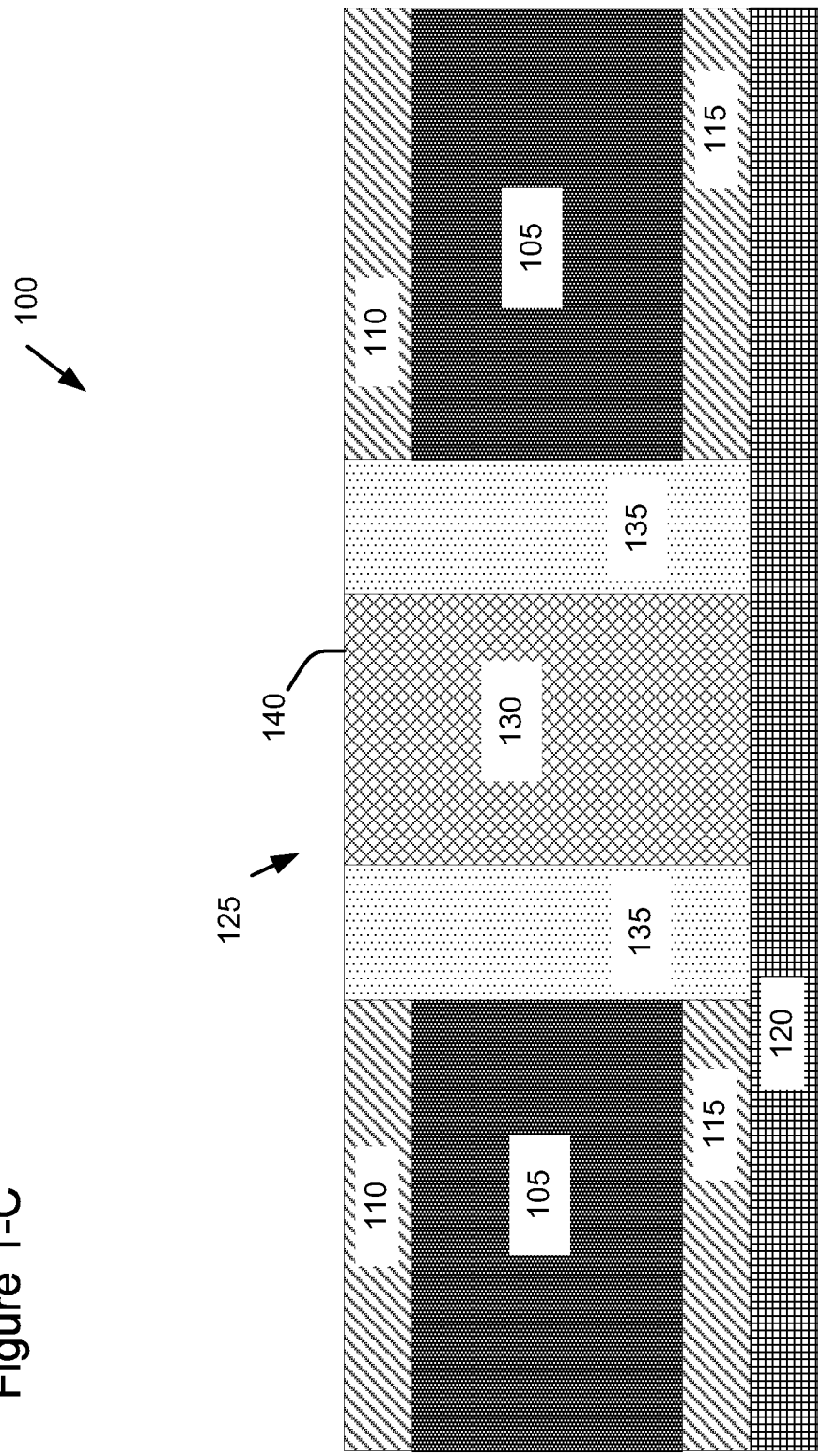
Figure 1-C

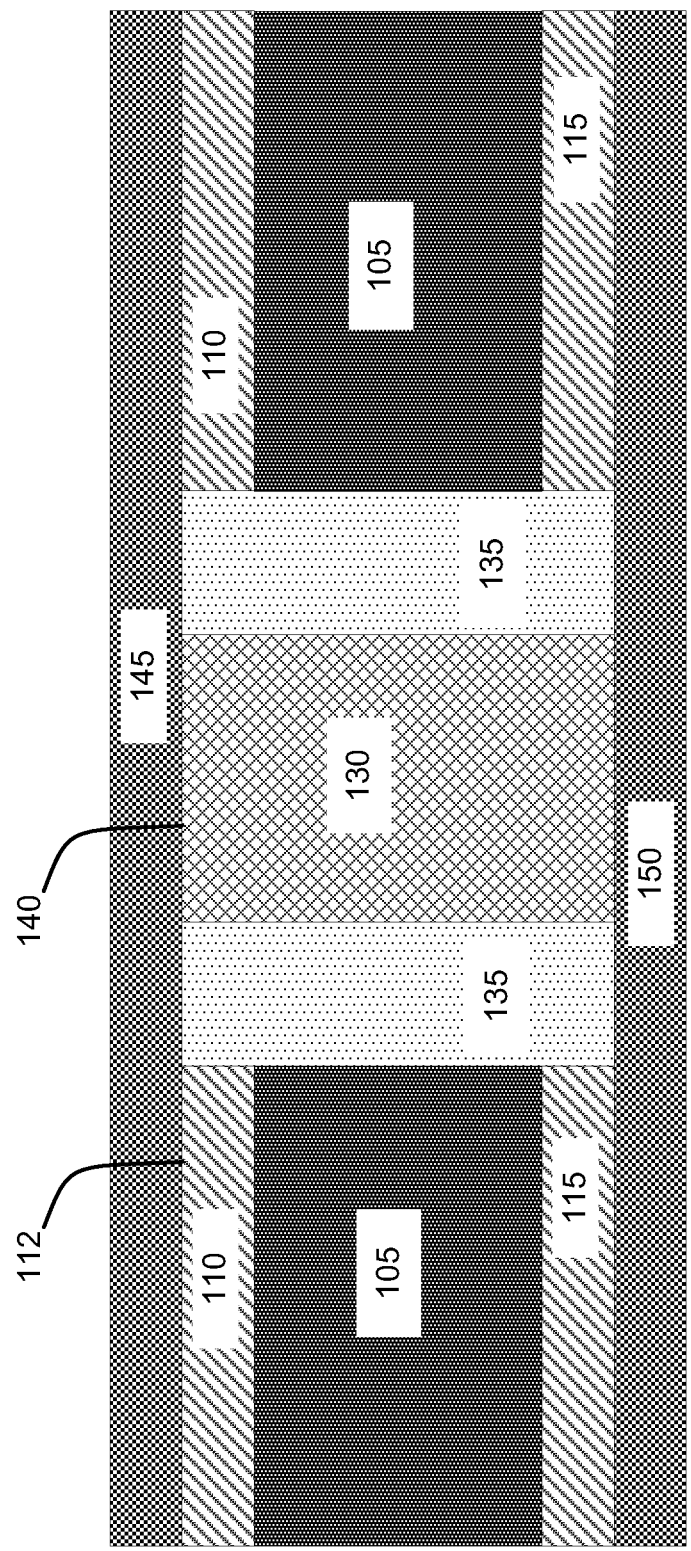
Figure 1-D

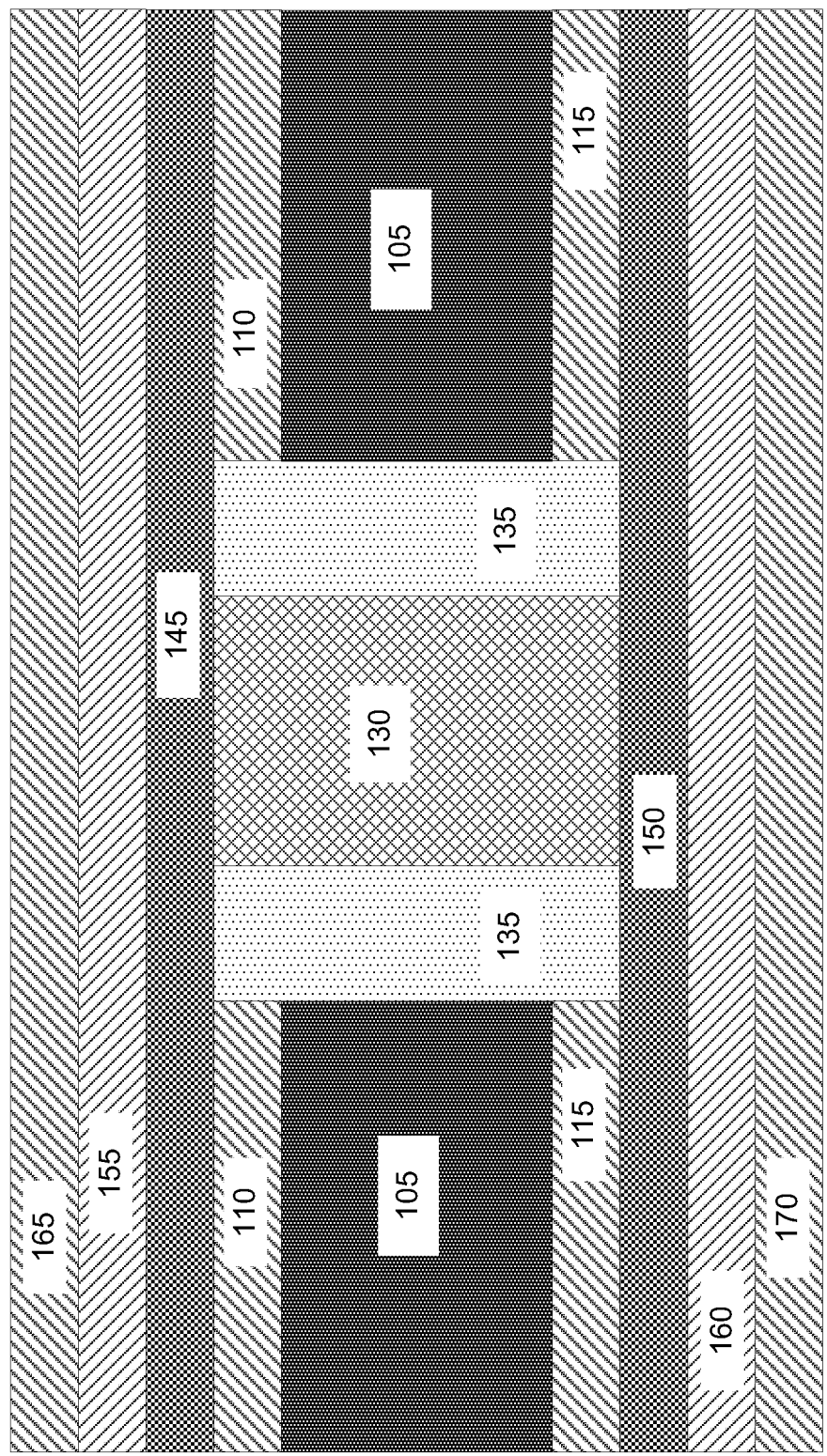
Figure 1-E

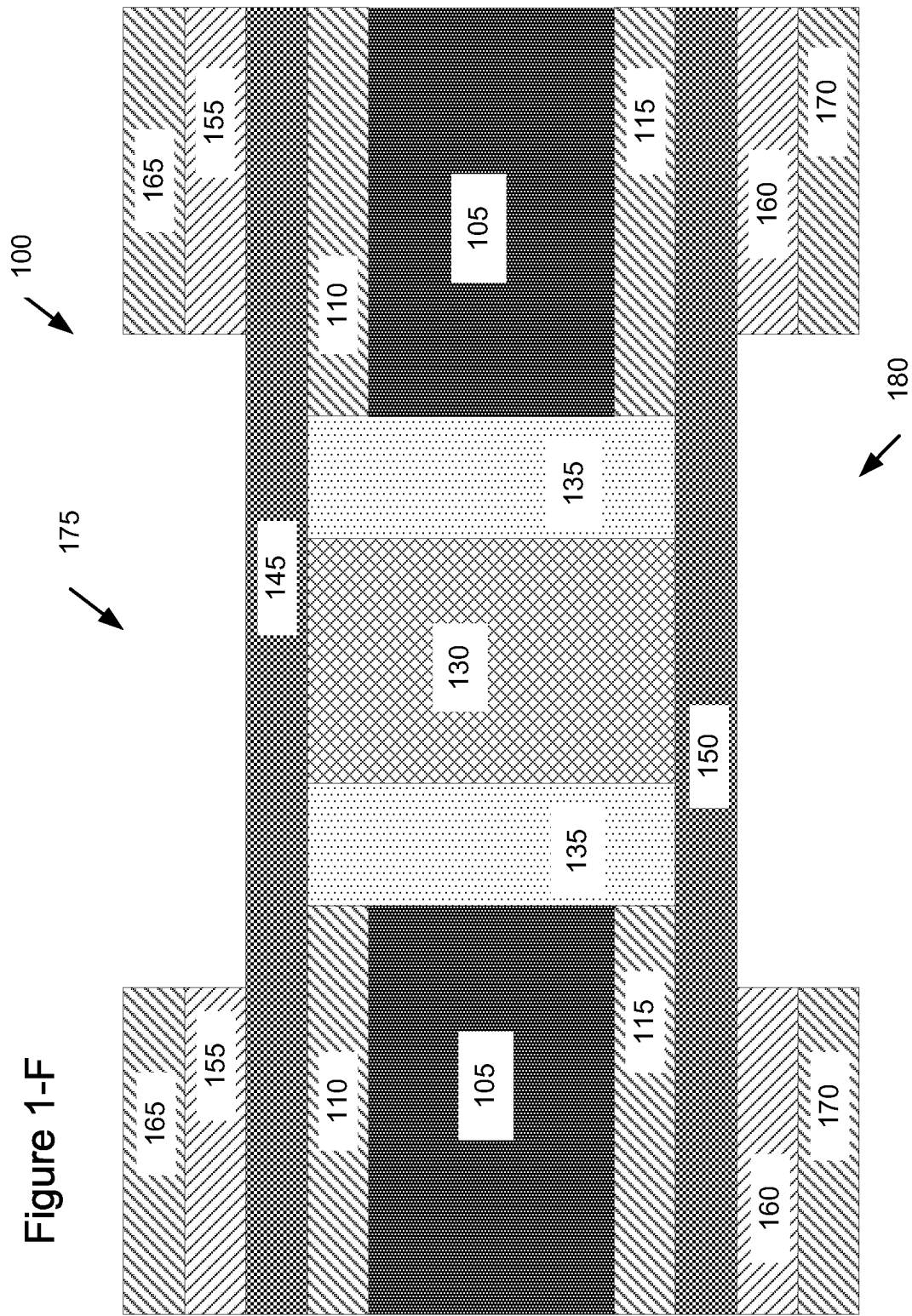
Figure 1-F

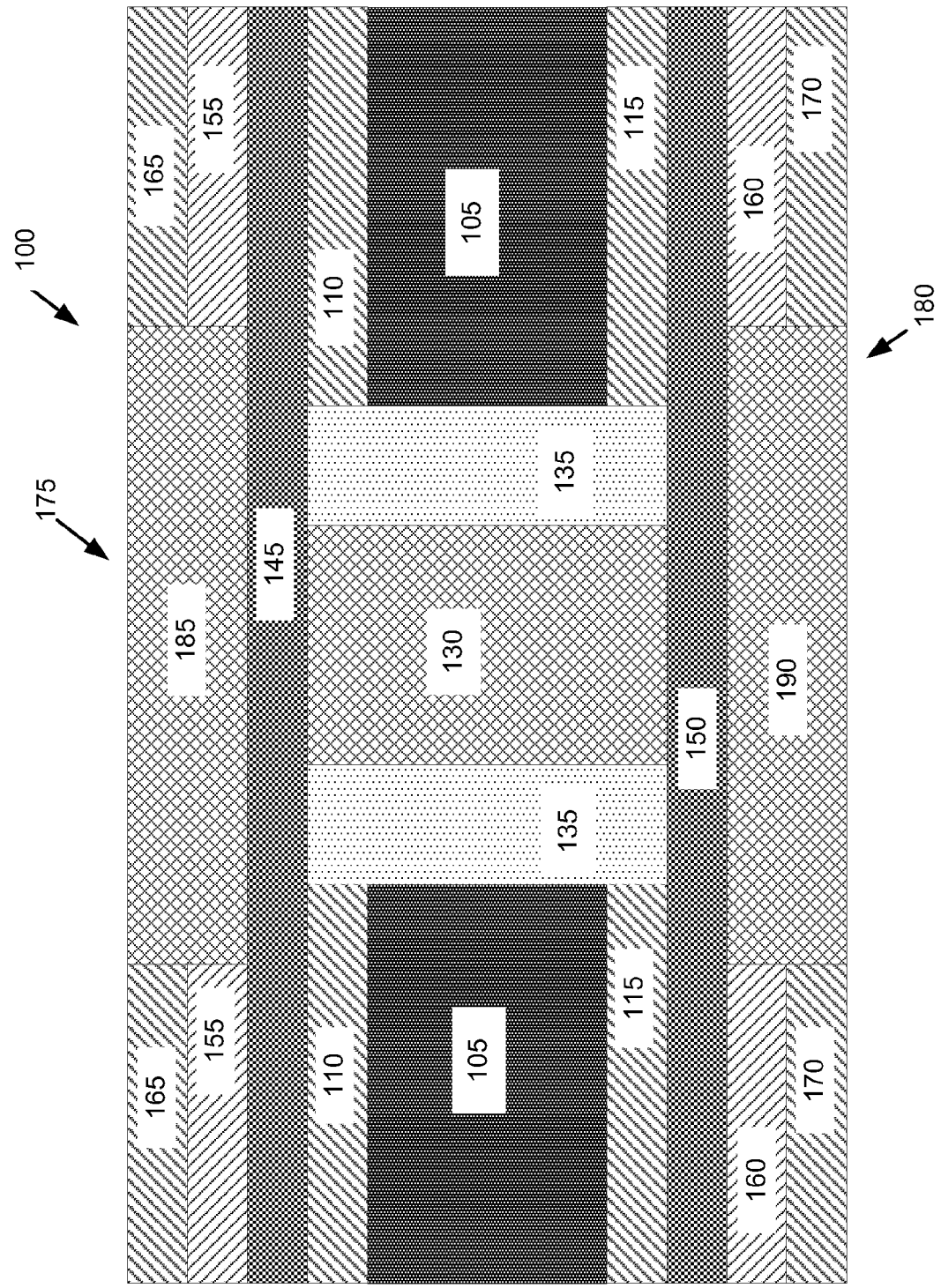
Figure 1-G

ADVANCED GROUNDING SCHEME

FIELD

Embodiments of the present disclosure generally relate to the field of microelectronic components for applications to radio frequency (RF) power amplifiers (PAs).

BACKGROUND

In several applications, it may be useful to embed a copper slug into an existing laminate core of a laminate substrate. For example, the copper slug may act as a heat sink for the laminate substrate, or provide other thermal advantages to the user or manufacturer of the laminate substrate. In addition, the copper slug may act as an electrical conductor to carry electrical signals from one side of the laminate substrate to the other.

However, in many embodiments the addition of the thermal slug may have one or more electrical disadvantages. Specifically, the addition of the copper slug to the laminate substrate may increase the signal pathway of one or more signals being routed through the laminate substrate. In these embodiments, the increased signal pathway may lead to an increased inductance, which may decrease the electrical performance of the electronic component built with the laminate substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1-A, 1-B, 1-C, 1-D, 1-E, 1-F, and 1-G illustrate an example of a laminate substrate at various stages of fabrication, according to various embodiments.

DETAILED DESCRIPTION

Figure 2:
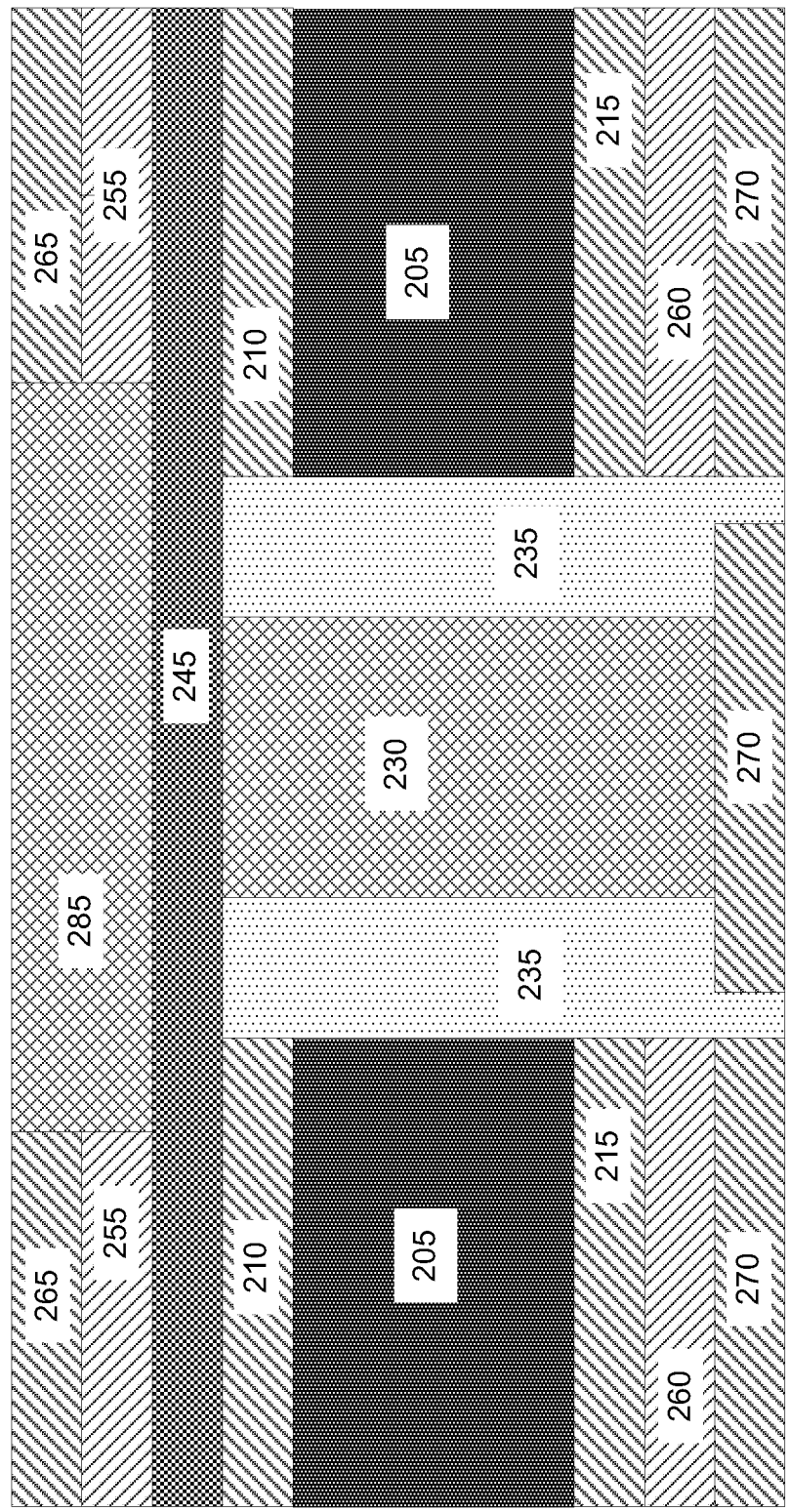
FIG. 2 illustrates another example of a laminate substrate, according to various embodiments.

Embodiments of the present disclosure include a laminate substrate having a laminate substrate with one or more routing layers coupled directly with a heat slug within the laminate substrate. These one or more routing layers may be considered "inner" routing layers of the laminate substrate. A slug may be contained within a cavity in the laminate core and one or more of the routing layers such that an outer side of the slug is coplanar with at least one of the one or more external routing layers. A capping layer may directly couple at least one of the one or more routing layers with the slug. A dielectric and one or more additional routing layers, which may be additional inner or outer routing layers, may then be coupled with the capping layer.

In embodiments, the slug may therefore be directly laterally coupled with one or more of the inner routing layers via the capping layer. This direct lateral connection may significantly reduce the electrical pathway of an electrical signal from the slug to at least one of the one or more inner routing layers. By reducing this electrical pathway, the inductance of the laminate substrate may be reduced.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

As described above, a slug may be coupled with one or more inner routing layers of a laminate substrate. FIGS. 1-A through 1-G depict one example process of constructing such a laminate substrate. Initially, with reference to FIG. 1-A, a laminate substrate 100 may include a laminate core 105. The laminate core 105 may be formed of an electrically insulating material such as FR-4, FR-5 or other epoxy resin based materials. In some embodiments, the laminate core may be referred to as a dielectric core material.

The laminate core 105 may have two routing layers 110 and 115 formed on first and second sides, respectively. Specifically, the routing layers 110 and 115 may be deposited, laminated, roll laminated, patterned, or otherwise formed on the laminate core 105. In embodiments, the routing layers 110 and 115 may be formed of copper, gold, silver, alloys thereof, or some other suitably conductive material. The routing layers 110 and 115 may be configured to be electrically and/or thermally conductive. In some embodiments, one or both of the routing layers 110 and 115 may be etched or patterned using a process such as laser etching, chemical etching, physical etching, or some other process. However, as shown in FIG. 1 routing layer 110 may be electrically and at least partially thermally separated from routing layer 115 by the laminate core 105.

As shown in FIG. 1-B, a cavity 125 may then be formed in the laminate substrate 100. Specifically, the cavity 125 may be formed in the routing layers 110 and 115 and the laminate core 105. In some embodiments, a taping layer 120 may be applied to the routing layer 115 either before, during, or after formation of the cavity 125 to supply structure to element 110 during formation of the cavity 125. In embodiments, the cavity 125 may be laser etched, chemically etched, drilled, or otherwise formed.

As shown in FIG. 1-C, a slug 130 may be positioned within the cavity 125. In embodiments, the slug 130 may have a round or circular cross-section, though in other embodiments the slug 130 may have a different shaped cross-section such as square, rectangular, or some other shape. The slug 130 may have a diameter of approximately 200 micrometers ($\mu m$), though in other embodiments the slug may be larger or smaller than 200 $\mu m$. For example, in some embodiments the slug may have a diameter of approximately 125 $\mu m$. In some embodiments, the slug 130 may be formed of one or more of a generally thermally and/or electrically conductive material such as copper, aluminum, gold, alloys thereof, or some other suitable thermally conductive material.

Figure 3:
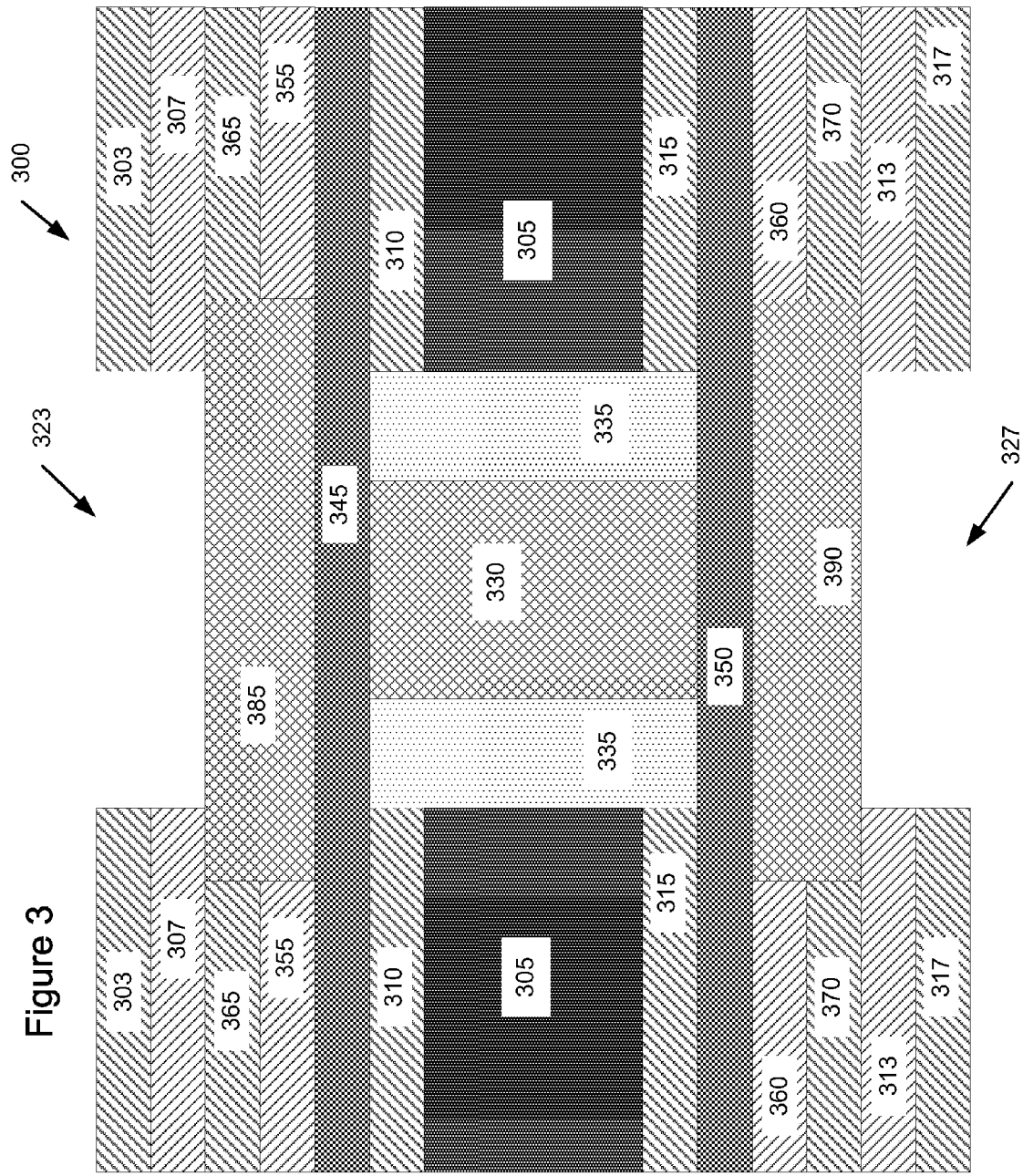
FIG. 3 illustrates another example of a laminate substrate, according to various embodiments.

In embodiments, the slug 130 may be positioned within the cavity 125 such that an outer side 140 of the slug 130 is generally co-planar with the routing layer 110. The cavity 125 may then be filled with an electrically non-conductive adhesive 135 such as epoxy, or other suitable material. The adhesive 135 may electrically isolate the slug 130 from, for example, the routing layers 110 and/or 115. It will be noted that although the adhesive 135 is shown as two distinct elements, FIG. 3 represents a cross section. Therefore, the adhesive 135 may be a single unitary element that generally surrounds the slug 130 within the cavity 125.

Figure 4:
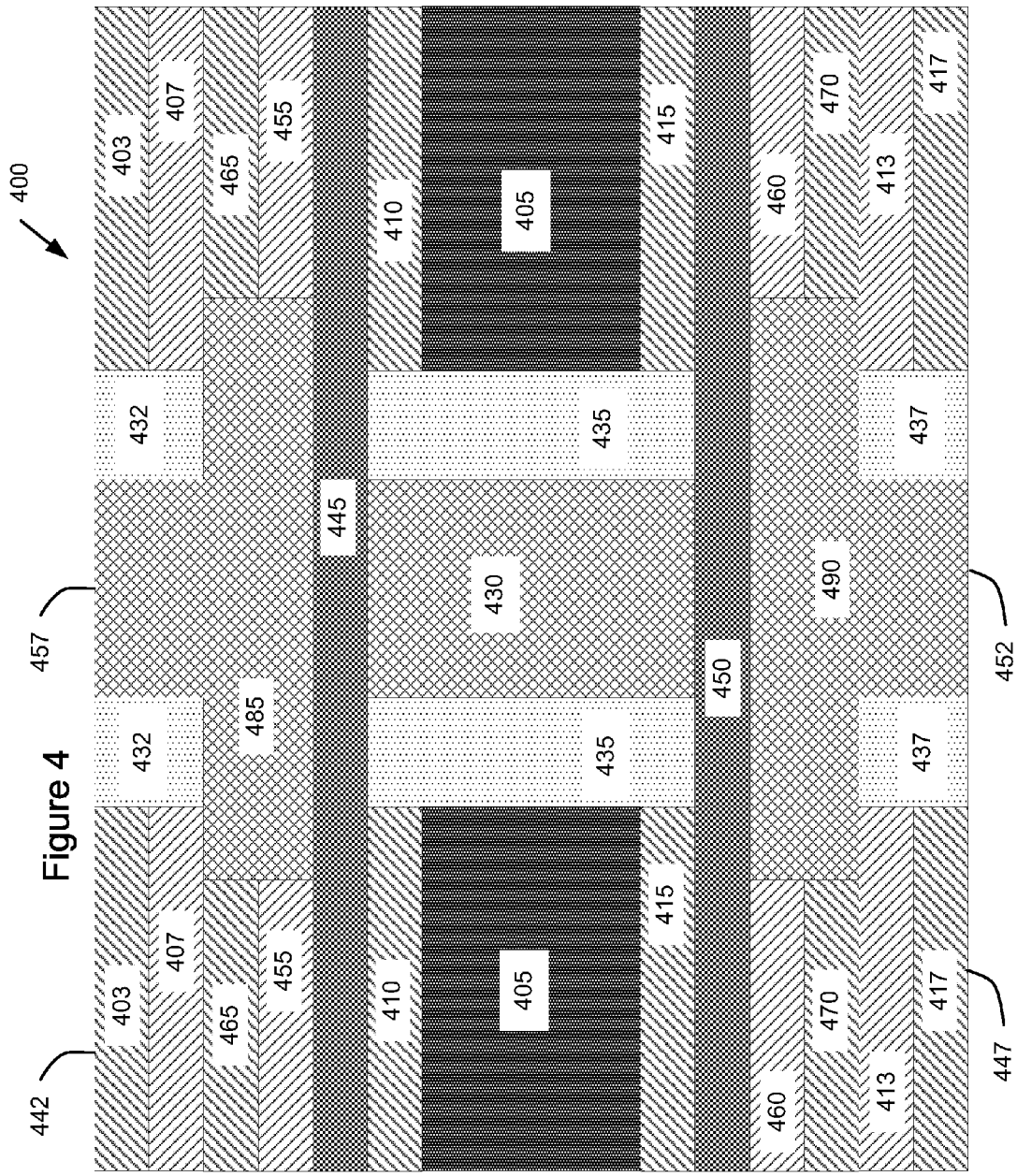
FIG. 4 illustrates another example of a laminate substrate, according to various embodiments.

As shown in FIG. 1-D, the taping layer 120 may be removed from the laminate substrate 100, and a capping layer may be applied to one or both sides of the laminate substrate 100. Specifically, as shown in FIG. 4, capping layers 145 and 150 may be applied to the laminate substrate 100. The capping layers 145 and 150 may be deposited, laminated, plated, rolled, or otherwise formed directly onto the laminate substrate 100. In embodiments, the capping layers 145 and 150 may be formed of one or more of an electrically and/or thermally conductive material such as copper, aluminum, gold, silver, alloys thereof, or some other suitable electrically conductive material. Specifically, the capping layers 145 or 150 may be generally parallel to routing layers 110 and 115, and be configured to transfer electrical signals and/or thermal energy between the slug 130 and the routing layers 110 and 115, respectively. In embodiments, before application of the capping layers 145 and 150, one or more of the adhesive 135, the slug 130, and the routing layers 110 and 115 may be chemically or physically etched or polished to form a relatively uniform surface. That is, the outer side 140 of the slug 130 may be polished so that it is level with the outer side 112 of the routing layer 110. Therefore, when the capping layer 145 is applied to the laminate substrate 100, the capping layer 145 may be uniformly connected to both the routing layer 110 and the slug 130.

As shown in FIG. 1-E, a dielectric layer 155 and 160 may then be formed on the capping layers 145 and 150, respectively. In embodiments, the dielectric layer 155 and 160 may be formed of an electrically and/or thermally neutral material such as prepreg, dielectric resins or others. In some embodiments one or both of the dielectric layers 155 or 160 may be formed of a different material than the laminate core 105 or each other. In embodiments, the dielectric layers 155 or 160 may be formed using a process such as lamination, roll lamination, deposition, or some other process.

Additional routing layers 165 and 170 may then be formed on the dielectric layers 155 or 160. In embodiments, the routing layers 165 or 170 may be formed using a process such as lamination, roll lamination, deposition, or some other process. In embodiments, one or both of the routing layers 165 or 170 may be etched or patterned using a process such as chemical etching, physical etching, or some other process. The routing layers 165 or 170 may be formed of one or more of copper, aluminum, gold, alloys thereof, or some other material, as described above with respect to routing layers 110 and 115. In embodiments, the routing layers 165 and 170 may be similar to routing layers 110 and 115, and configured to be electrically and/or thermally conductive.

As shown in FIG. 1-F, a cavity 175 may be formed in the dielectric layer 155 and the routing layer 165. Similarly, a cavity 180 may be formed in the dielectric layer 160 and the routing layer 170. In embodiments, the cavities 175 and 180 may be chemically etched, laser etched, physically etched, drilled, or created through some other process. Although not shown in FIG. 1-F, in some embodiments the cavity may extend at least partially through the capping layers 145 or 150.

As shown in FIG. 1-G, a conductive element 185 may be formed within the cavity 175. Additionally, a conductive element 190 may be formed within the cavity 180. In embodiments, the conductive elements 185 and 190 may be plated, though in other embodiments they may be preformed and placed within the cavities 175 and 180, they may be deposited, or they may be formed according to one or more other processes. In embodiments, the conductive elements 185 and 190 may be formed of an electrically and/or thermally conductive material such as copper, aluminum, gold, alloys thereof, or some other material. As shown in FIG. 1-G, one or both of the conductive elements 185 and 190 may be slightly larger than the slug 130, that is having a larger diameter or cross-section. However, in other embodiments one or both of the conductive elements 185 or 190 may have a cross-section that is the same as, or smaller than, the slug 130.

The laminate substrate 100 depicted in FIG. 1-G may provide significant advantages over currently existing laminate substrates. In the embodiment of the laminate substrate 100 depicted in FIG. 1-G, routing layers 110 and 115 may be considered "inner" routing layers, while routing layers 165 and 170 of the laminate substrate 100 may be "outer" routing layers. In some existing laminate substrates the slug may only be directly coupled with an outer routing layer, and then the outer routing layer is coupled with an inner routing layer via a filled or plated via. In these existing laminate substrates, the electrical pathway of a signal from the slug to an inner routing layer may be relatively long, and may result in the generation of relatively larger inductance in the laminate substrate. By contrast, and as shown in FIG. 1-G, the slug 130 may be coupled with one or both of the routing layers 110 or 115 via the capping layers 145 and 150, respectively. By directly coupling the slug 130 to the capping layers 145 or 150, and directly coupling the capping layers 145 or 150 to the routing layers 110 or 115, the length of the electrical pathway between the slug 130 and the routing layers 110 or 115 may be reduced as compared to existing laminate substrates. Specifically, because the outer side 140 of the slug 130 is generally level with the outer side 112 of an inner routing layer such as routing layer 110, i.e. the outer side 140 of the slug 130 is directly coupled to the outer side 112 of the routing layer 110, the electrical pathway is significantly reduced. By reducing the length of the electrical pathways between the slug 130 and the routing layers 110 or 115, the inductance of the laminate substrate 100 may be significantly reduced. However, the advantages of inserting a slug 130 into a laminate substrate 100, specifically the thermal advantages that the slug 130 may provide, may still be retained.

FIG. 2 shows an alternative embodiment of a laminate substrate 200, in accordance with the present disclosure. Elements of the laminate substrate 200 may be similar to the elements of the laminate substrate 100 in FIGS. 1-A through 1-G, and may be numbered similarly. Specifically, laminate substrate 200 may include routing layers 265, 210, and 215, which may be similar to routing layers 165, 110, and 115, respectively. Specifically, routing layers 210 and 215 may be considered "inner" routing layers while routing layer 265 may be considered an "outer" routing layer. Additionally, the laminate substrate 200 may include a capping layer 245 which may be similar to the capping layer 145. Additionally, the laminate substrate 200 may include dielectric layers 255 and 260 which may be similar to dielectric layers 155 and 160, respectively. Additionally, the laminate substrate 200 may include a laminate core 205, slug 230, and adhesive 235 which may be similar to laminate core 105, slug 130, and adhesive 135, respectively.

The laminate substrate 200 may be different from laminate substrate 100, because slug 230 may directly contact routing layer 270, as shown in FIG. 2. Additionally, a second capping layer and a second conductive element, such as capping layer 150 and conductive element 190 of laminate substrate 100, may not be present in the laminate substrate 200. In this embodiment, the routing layer 270 may be a ground plane, and the central element of the routing layer 270 may be a ground pad. In this embodiment, the routing layers 270, 210, and 265 may be electrically coupled with one another by way of the slug 230, the capping layer 245, and the conductive element 285. However, the routing layer 215 may be electrically isolated from the other routing layers 265, 210, and 270.

FIG. 3 depicts another example of a laminate substrate 300, in accordance with various embodiments. Elements of the laminate substrate 300 may be similar to the elements of the laminate substrate 100 in FIGS. 1-A through 1-G, and may be numbered similarly. Specifically, laminate substrate 300 may include routing layers 365, 310, 315, and 370, which may be similar to routing layers 165, 110, 115, and 160, respectively. Additionally, the laminate substrate 300 may include capping layers 345 and 350, which may be similar to the capping layers 145 and 150. Additionally, the laminate substrate 300 may include dielectric layers 355 and 360 which may be similar to dielectric layers 155 and 160, respectively. Additionally, the laminate substrate 300 may include laminate core 305, slug 330, and adhesive 335 which may be similar to laminate core 105, slug 130, and adhesive 135, respectively.

The laminate substrate 300 may further include additional dielectric layers 307 and 313, which may be similar to dielectric layers 360 and 355. In addition, the laminate substrate 300 may include routing layers 303 and 317, which may be constructed of a material similar to routing layers 365, 310, 315, and/or 370. In this embodiment, routing layers 365, 310, 315, and 370 may all be considered "inner" routing layers, while routing layers 303 and 317 may be considered "outer" routing layers. In embodiments, routing layer 303 may be electrically separated from one or both of routing layer 365 and conductive element 385 by dielectric layer 307. Additionally, routing layer 317 may be electrically separated from one or both of routing layer 370 and conductive element 390 by dielectric layer 313. In embodiments, one or both of dielectric layer 307 and routing layer 303 may at least partially overlap conductive element 385, as shown. Additionally, in embodiments one or both of dielectric layer 313 and routing layer 317 may at least partially overlap conductive element 390.

In some embodiments, at least a part of dielectric layer 307 and routing layer 303 may be laser etched, chemically etched, drilled, or otherwise processed to form a cavity 323. The cavity 323 may expose the conductive element 385. In embodiments, the cavity 323 may be configured such that the laminate substrate 300 may mate with a die (not shown) or some other component of a computing system such that the die may be directly physically, electrically, and/or thermally coupled with conductive element 385. In some embodiments, dielectric layer 313 and routing layer 317 may be similarly processed such that a cavity 327 is formed in dielectric layer 313 and routing layer 317, and conductive element 390 is exposed. Similarly to cavity 323, cavity 327 may be configured such that a die or other component of a computing system may be directly physically, electrically, and/or thermally coupled with conductive element 390. In other embodiments one or both of air cavities 323 or 327 may be configured to not mate with any component of a computing system but instead allow, for example, conductive elements 385 or 390 to be exposed to the atmosphere for thermal cooling or other purposes.

FIG. 4 depicts another example of a laminate substrate 400, in accordance with various embodiments. Elements of the laminate substrate 400 may be similar to the elements of the laminate substrate 300 in FIG. 3, and may be numbered similarly. Specifically, laminate substrate 400 may include routing layers 465, 410, 415, 470, 403, and 417, which may be similar to routing layers 365, 310, 315, 360, 303, and 317 respectively. In embodiments, routing layers 465, 410, 415, and 470 may be considered "inner" routing layers, while routing layers 403 and 417 may be considered "outer" routing layers. Additionally, the laminate substrate 400 may include capping layers 445 and 450, which may be similar to the capping layers 345 and 350. Additionally, the laminate substrate 400 may include dielectric layers 407, 455, 460, and 413, which may be similar to dielectric layers 307, 355, 360, and 313, respectively. Additionally, the laminate substrate 400 may include laminate core 405, slug 430, adhesive 435, and conductive elements 485 and 490, which may be similar to laminate core 305, slug 330, adhesive 335, and conductive elements 385 and 390, respectively. In addition, the conductive elements 485 and 490 of laminate substrate 400 may extend to be coplanar with the outer surfaces 442 and 447 of the routing layers 403 and 417, respectively. Specifically, the outer surface 457 of conductive element 485 may be coplanar with the outer surface 442 of routing layer 403. Similarly, the outer surface 452 of conductive element 490 may be coplanar with the outer surface 447 of routing layer 417.

In some embodiments, adhesive 432, which may be constructed of a material that is similar to adhesive 435, may be used to electrically isolate the conductive element 485 from the routing layer 403. Similarly, adhesive 437, which may be similar to adhesive 435, may be used to electrically isolate the conductive element 490 from routing layer 417. Although the conductive elements 485 and 490 are shown as electrically isolated from the routing layers 403 and 417, in other embodiments the conductive elements 485 and 490 may be electrically coupled with the routing layers 403 or 417. In some embodiments the conductive elements 485 or 490 may have a different shape or thickness, for example being generally rectangular, or wider on the top portion of the conductive elements 485 or 490 than the bottom portion.

Figure 5:
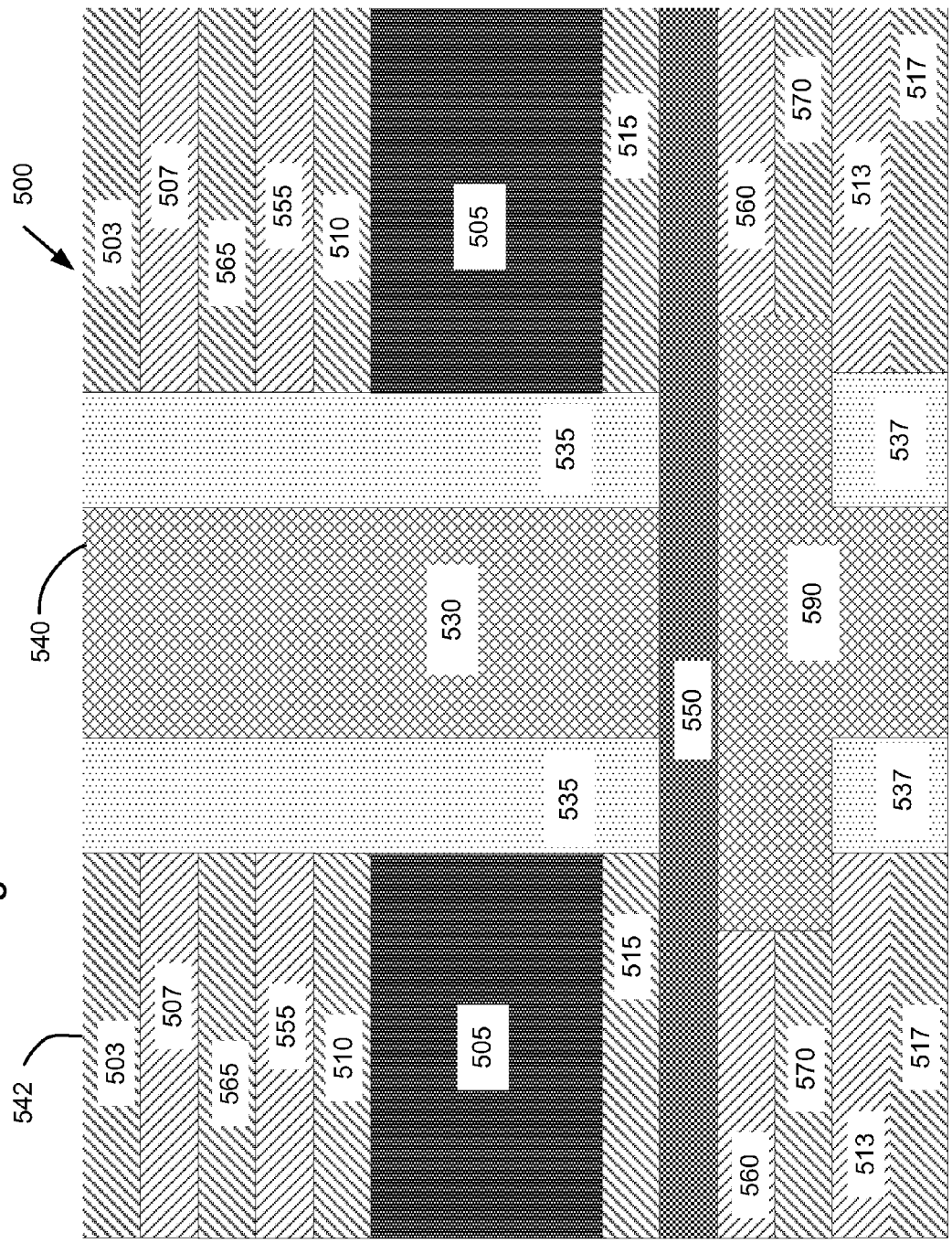
FIG. 5 illustrates another example of a laminate substrate, according to various embodiments.

FIG. 5 depicts another example of a laminate substrate 500, in accordance with various embodiments. Elements of the laminate substrate 500 may be similar to the elements of the laminate substrate 400 in FIG. 4, and may be numbered similarly. Specifically, laminate substrate 500 may include routing layers 565, 510, 515, 570, 503, and 517, which may be similar to routing layers 465, 410, 415, 460, 403, and 417 respectively. In embodiments, routing layers 565, 510, 515, and 570 may be considered "inner" routing layers, while routing layers 503 and 517 may be considered "outer" routing layers. Additionally, the laminate substrate 500 may include capping layer 550, which may be similar to the capping layer 450. Additionally, the laminate substrate 500 may include dielectric layers 507, 555, 560, and 513, which may be similar to dielectric layers 407, 455, 460, and 413, respectively. Additionally, the laminate substrate 500 may include laminate core 505, slug 530, adhesive 535, conductive element 590, and adhesive 537 which may be similar to laminate core 405, slug 430, adhesive 435, conductive element 490, and adhesive 437 respectively. In addition, the conductive elements 485 and 490 of laminate substrate 400 may extend to be coplanar with the outer surface s 442 and 447 of the routing layers 403 and 417, respectively. In embodiments, the laminate substrate 500 may not include a capping layer between routing layer 510 and dielectric layer 555. Additionally, the outer side 540 of the slug 530 may be level with the outer side 542 of routing layer 503. However, as shown in FIG. 5, the slug 530 may be directly coupled with inner routing layer 515 by way of capping layer 550.

Figure 6:
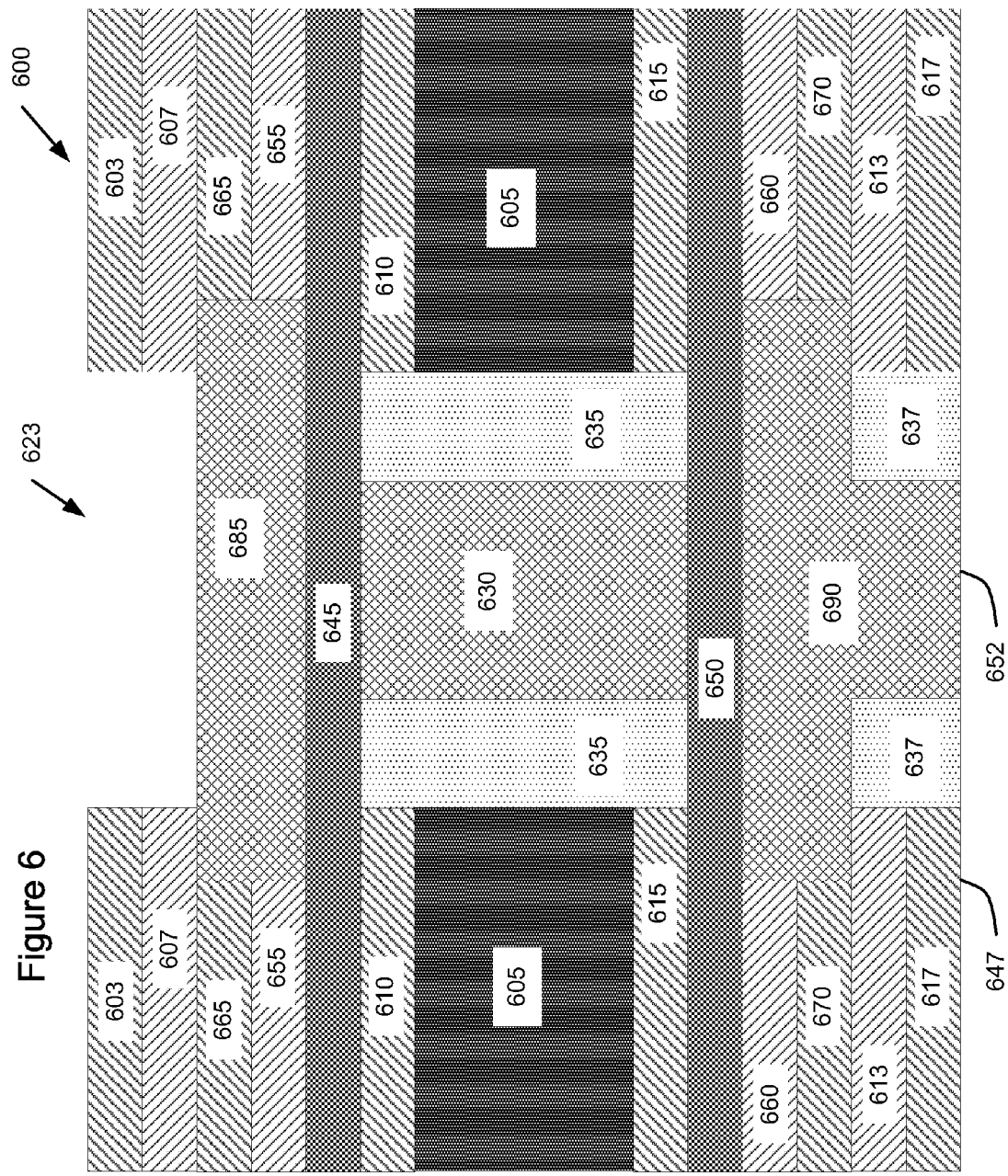
FIG. 6 illustrates another example of a laminate substrate, according to various embodiments.

FIG. 6 depicts another example of a laminate substrate 600, in accordance with various embodiments. Elements of the laminate substrate 600 may be similar to the elements of the laminate substrate 300 in FIG. 3 or laminate substrate 400 in FIG. 4, and may be numbered similarly. Specifically, laminate substrate 600 may include routing layers 603, 665, 610, 615, 670, and 617, which may be similar to routing layers 303, 365, 310, 315, 370, and 317 respectively. In embodiments, routing layers 665, 610, 615, and 670 may be "inner" routing layers, while routing layers 603 and 617 may be "outer" routing layers. Additionally, the laminate substrate 600 may include capping layers 645 and 650, which may be similar to the capping layers 645 and 350, respectively. Additionally, the laminate substrate 600 may include dielectric layers 607, 655, 660, and 613, which may be similar to dielectric layers 307, 355, 360, and 313, respectively. Additionally, the laminate substrate 600 may include laminate core 605, slug 630 and adhesive 635, which may be similar to laminate core 305, slug 330 and adhesive 335, respectively. In embodiments, laminate substrate 600 may include cavity 623 and conductive element 685, which may be similar to cavity 323 and conductive element 385, respectively. Specifically, the cavity 323 may be configured such that the conductive element 685 can directly physically, electrically, and/or thermally coupled with a die or another component of a computing system. In other embodiments, the cavity 323 may be configured such that the conductive element 685 is exposed to the atmosphere, for example for air cooling. In embodiments, the laminate substrate 600 may further include a conductive element 690 and adhesive 637, which may be similar to conductive element 490 and adhesive 437, respectively. Specifically, the outer side 452 of conductive element 690 may be coplanar with the outer side 647 of routing layer 617.

Figure 7:
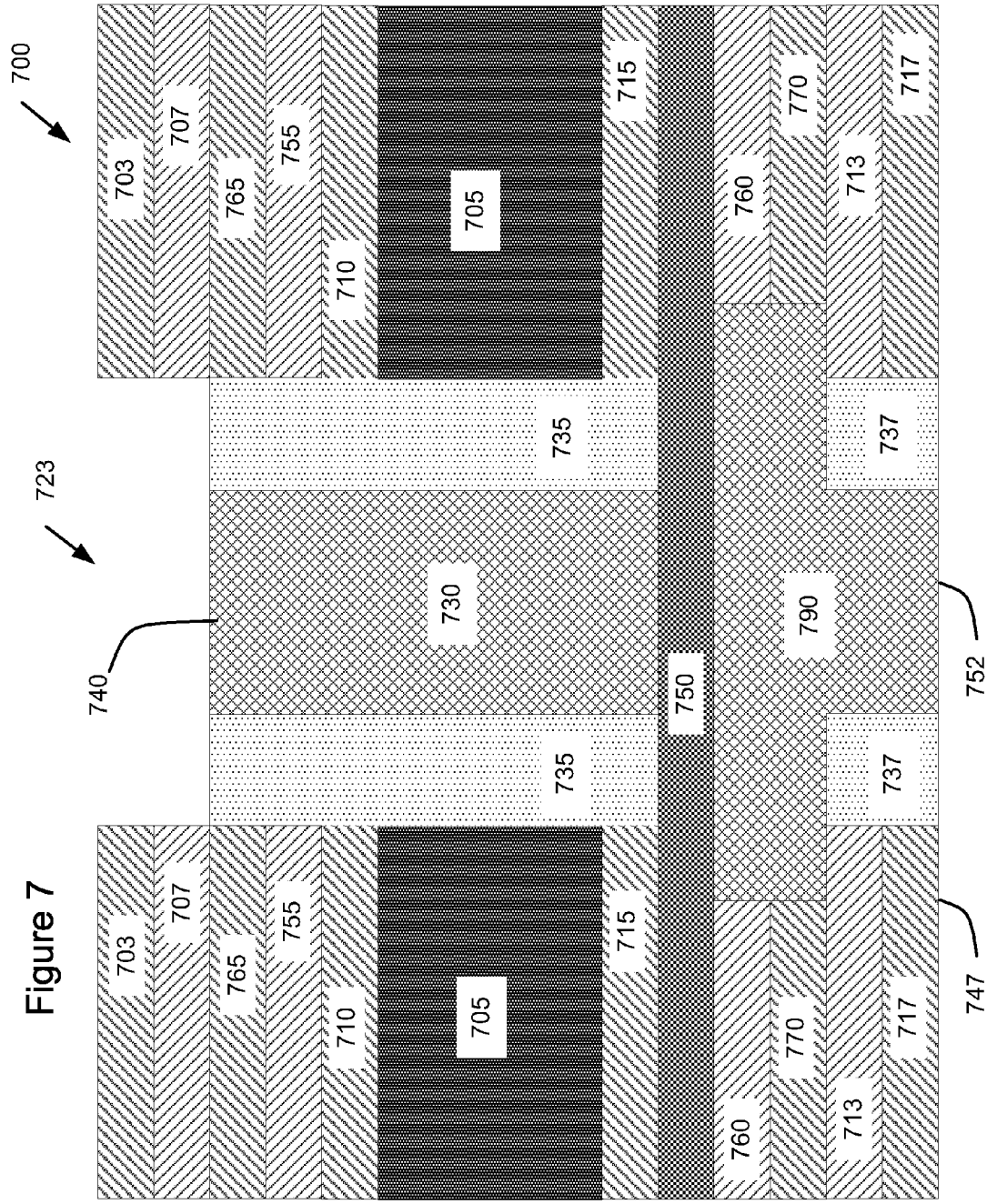
FIG. 7 illustrates another example of a laminate substrate, according to various embodiments.

FIG. 7 depicts another example of a laminate substrate 700, in accordance with various embodiments. Elements of the laminate substrate 700 may be similar to the elements of the laminate substrate 600 in FIG. 6, and may be numbered similarly. Specifically, laminate substrate 700 may include routing layers 703, 765, 710, 715, 770, and 717, which may be similar to routing layers 603, 665, 610, 615, 670, and 617 respectively. Routing layers 765, 710, 715, and 770 may be "inner" routing layers, while routing layers 703 and 717 may be "outer" routing layers. Additionally, the laminate substrate 700 may include capping layer 750, which may be similar to the capping layer 650. Additionally, the laminate substrate 700 may include dielectric layers 707, 755, 760, and 713, which may be similar to dielectric layers 607, 655, 660, and 613, respectively. Additionally, the laminate substrate 700 may include laminate core 705, slug 730 and adhesive 735, which may be similar to laminate core 605, slug 630 and adhesive 335, respectively. In embodiments, the laminate substrate 700 may further include conductive element 790 and adhesive 737, which may be similar to conductive element 690 and adhesive 637. Specifically, the outer side 752 of conductive element 790 may be coplanar with the outer side 747 of routing layer 717. In embodiments, the laminate substrate 700 may not have a conductive element such as conductive element 685. Instead, the outer side 740 of the slug 730 may be directly exposed within the cavity 723. Similarly to cavity 623, the cavity 723 may be configured such that a die or other computer component may physically, electrically, or thermally couple with slug 730. In other embodiments, the cavity 723 may be configured such that the outer side 740 of the slug 730 is exposed to the atmosphere, for example for thermal cooling of the slug 730.

The above laminate substrates 100, 200, 300, 400, 500, 600, or 700 are intended merely as examples. It will be understood that certain elements, for example routing layers, dielectric layers, conductive elements, or slugs may not be drawn to scale either vertically or laterally. Additionally, it will be understood that where certain elements are shown as coplanar, for example the outer side 740 of slug 730 and the physical coupling of dielectric layer 707 and routing layer 765, in other embodiments different dimensions or locations of different sides may be realized. In embodiments one or more different variations or features of embodiments of the laminate substrates 100, 200, 300, 400, 500, 600, or 700 may be present.

Figure 8:
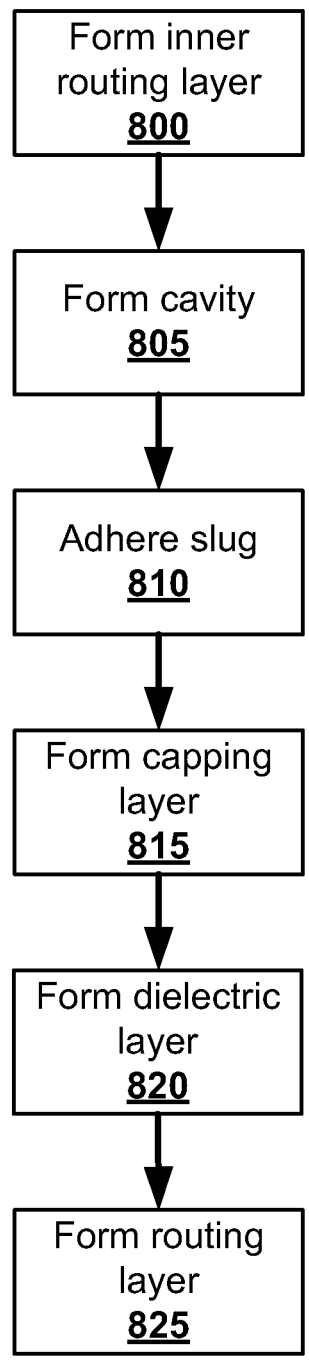
FIG. 8 illustrates an example of a process for forming a laminate substrate, according to various embodiments.

FIG. 8 depicts a process for constructing a laminate substrate such as laminate substrates 100, 200, 300, 400, 500, 600, or 700. FIG. 8 will be described with reference to FIGS. 1-A through 1-G for the sake of clarity, however, the elements of FIG. 8 may also apply, for example, to the laminate substrates 200, 300, 400, 500, 600, and 700 of FIGS. 2, 3, 4, 5, 6, and 7, respectively.

Initially, an inner routing layer such as routing layer 110 or 115 may be formed on laminate core such as laminate core 105 at 800. This forming of the inner routing layer may be seen, for example in FIG. 1-A. Next a cavity may be formed in one or both of the inner routing layers and the laminate core at 805. For example, cavity 125 may be formed in inner routing layers 110 and 115, and laminate core 105 as shown in FIG. 1-B.

Next, a slug may be positioned with the cavity and adhered to the laminate core at 810. For example, a slug such as slug 130 may be positioned with the cavity 125 and adhered to the laminate core via an adhesive such as adhesive 135.

After the slug is adhered at 810, a capping layer may be formed over the slug and at least one inner routing layer at 815. For example, capping layer 145 may be formed over the slug 130, adhesive element 135, and routing layer 110 as shown in FIG. 1-D. Additionally or alternatively, a capping layer such as capping layer 150 may be formed over the slug 130 and the routing layer 115.

Next, a dielectric layer may be formed at 820. Specifically, a dielectric layer such as dielectric layer 155 may be formed over the capping layer such as capping layer 145, as shown in FIG. 1-E. Additionally or alternatively, a dielectric layer such as dielectric layer 160 may be formed over capping layer 150, as shown in FIG. 1-E.

Finally, a routing layer such as routing layers 165 or 170 may be formed at 825. In embodiments, the routing layer may be formed over the dielectric layer(s) formed at 820, as shown in FIG. 1-E.

As noted above, the process described with respect to FIG. 8 is described as applying to the laminate substrate 100 of FIGS. 1-A through 1-G. However, the process could be applied, with or without certain modifications, to the laminate substrates 200, 300, 400, 500, 600, or 700 of FIGS. 2-7, respectively.

Figure 9:
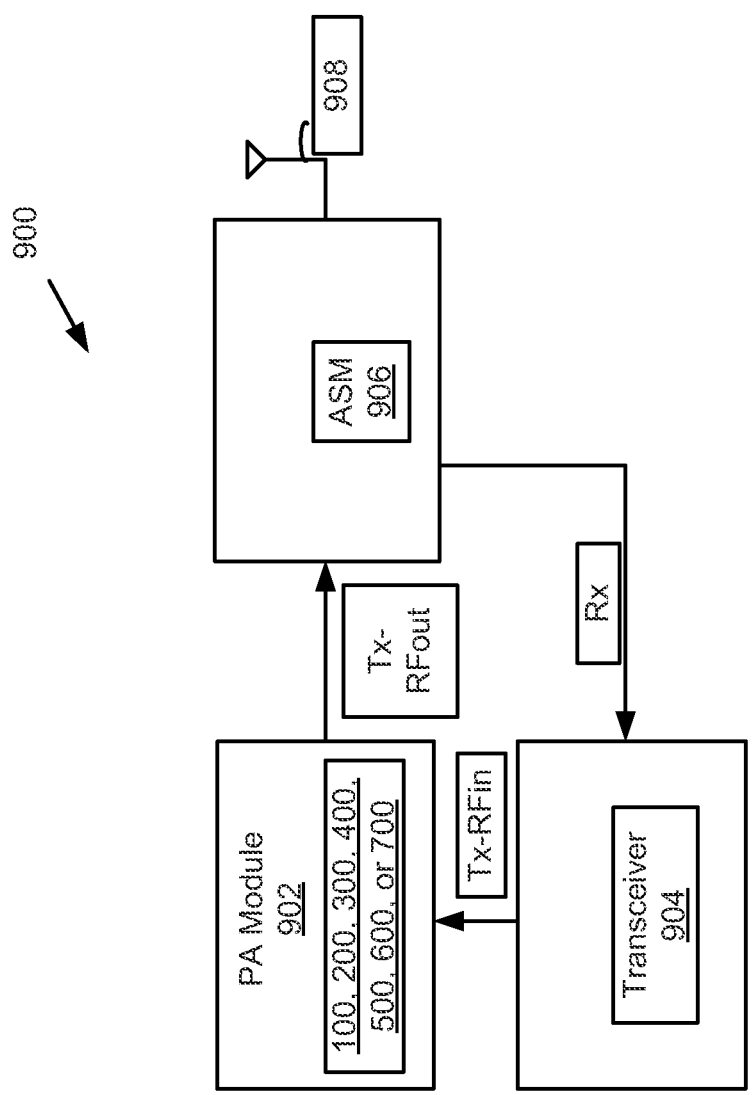
FIG. 9 schematically illustrates an example system including a laminate substrate with an embedded slug, according to various embodiments.

Embodiments of a laminate substrate (e.g., the laminate substrates 100, 200, 300, 400, 500, 600, or 700) described herein, and apparatuses including such laminate substrates may be incorporated into various other apparatuses and systems. A block diagram of an example system 900 is illustrated in FIG. 9. As illustrated, the system 900 includes a PA module 902, which may be an RF PA module in some embodiments. The system 900 may include a transceiver 904 coupled with the PA module 902 as illustrated. The PA module 905 may include one or more laminate substrates (e.g., the laminate substrates 100, 200, 300, 400, 500, 600, or 700) described herein.

The PA module 902 may receive an RF input signal, RFin, from the transceiver 904. The PA module 902 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 9.

The amplified RF output signal, RFout, may be provided to an antenna switch module (ASM) 906, which effectuates an over-the-air (OTA) transmission of the RF output signal, RFout, via an antenna structure 908. The ASM 906 may also receive RF signals via the antenna structure 908 and couple the received RF signals, Rx, to the transceiver 904 along a receive chain.

In various embodiments, the antenna structure 908 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 900 may be any system including power amplification. The PA module 902 may provide an effective switch device for power-switch applications, which may include power conditioning applications, such as, for example, Alternating Current (AC)-Direct Current (DC) converters, DC-DC converters, DC-AC converters, and the like. In various embodiments, the system 900 may be particularly useful for power amplification at high radio frequency power and frequency. For example, the system 900 may be suitable for any one or more of terrestrial and satellite communications, radar systems, and possibly in various industrial and medical applications. More specifically, in various embodiments, the system 900 may be a selected one of a radar device, a satellite communication device, a mobile handset, a cellular telephone base station, a broadcast radio, or a television amplifier system.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
   a laminate core having a first cavity;
   a slug having a first side and a second side opposite the first side of the slug, wherein the slug is positioned within the first cavity of the laminate core and coupled with the laminate core via an adhesive;
   a capping layer having a first side directly coupled with the first side of the slug and a second side that is opposite the first side of the capping layer, wherein the capping layer is electronically conductive;
   a first dielectric having a first side coupled with the second side of the capping layer and a second side opposite the first side of the first dielectric;
   a routing layer having a first side coupled with the second side of the first dielectric and a second side opposite the first side of the routing layer, wherein the routing layer is electronically conductive; and
   a second cavity in the first dielectric and the routing layer, and a plated element positioned within the second cavity, wherein the plated element has a first side that is directly coupled with the second side of the capping layer and a second side opposite the first side of the plated element.

2. The apparatus of claim 1, wherein the slug is a copper slug.

3. The apparatus of claim 1 wherein the second side of the plated element is coplanar with the second side of the routing layer.

4. The apparatus of claim 1, further comprising:
   a second dielectric having a first side coupled with the second side of the routing layer and a second side opposite the first side of the second dielectric; and
   an outer routing layer having a first side coupled with the second side of the second dielectric and a second side opposite the first side of the outer routing layer, wherein the outer routing layer is electronically conductive.

5. The apparatus of claim 4 further comprising:
   a third cavity in the second dielectric and the outer routing layer, wherein
   the second side of the plated element is exposed to the third cavity.

6. The apparatus of claim 1, wherein the first side of the slug has a diameter greater than 200 micrometers.

7. The apparatus of claim 1, wherein the laminate core is a dielectric core layer.

8. The apparatus of claim 1, wherein the second side of the slug is coupled directly with a second routing layer.

9. The apparatus of claim 1, wherein the second side of the slug is coplanar with a surface of the apparatus.

10. A system comprising:
a power amplification module;
a laminate substrate coupled with the power amplification module, the laminate substrate comprising:
a laminate core having a first cavity;
a slug having a first side and a second side opposite the first side of the slug, wherein the slug is positioned within the first cavity of the laminate core and coupled with the laminate core via an adhesive;
a capping layer having a first side directly coupled with the first side of the slug and a second side that is opposite the first side of the capping layer, wherein the capping layer is electronically conductive;
a first dielectric having a first side coupled with the second side of the capping layer and a second side opposite the first side of the first dielectric;
a routing layer having a first side coupled with the second side of the first dielectric and a second side opposite the first side of the routing layer, wherein the routing layer is electronically conductive; and
a second cavity in the first dielectric and the routing layer, and a plated element positioned within the second cavity, wherein the plated element has a first side that is directly coupled with the second side of the capping layer and a second side opposite the first side of the plated element.

11. The system of claim 10, wherein the slug is a copper slug.

12. The system of claim 10, wherein the second side of the plated element is coplanar with the second side of the routing layer.

13. The system of claim 10, wherein the first side of the slug has a diameter greater than 200 micrometers.

14. The apparatus of claim 1 further comprising:
a second capping layer having a first side directly coupled with the second side of the slug and a second side that is opposite the first side of the second capping layer, wherein the second capping layer is electronically conductive;
a second dielectric having a first side coupled with the second side of the second capping layer and a second side opposite the first side of the second dielectric; and
a second routing layer having a first side coupled with the second side of the second dielectric and a second side opposite the first side of the second routing layer, wherein the second routing layer is electronically conductive.

15. An apparatus comprising:
a laminate core with a first cavity, wherein the laminate core has a first side coupled with the capping layer and a second side opposite the first side of the laminate core;
a slug having a first side and a second side opposite the first side of the slug, wherein the slug is positioned within the first cavity of the laminate core and coupled with the laminate core via an adhesive;
a capping layer having a first side directly coupled with the first side of the slug and a second side that is opposite the first side of the capping layer, wherein the capping layer is electronically conductive;
a first dielectric having a first side coupled with the second side of the capping layer and a second side opposite the first side of the first dielectric;
a routing layer having a first side coupled with the second side of the first dielectric and a second side opposite the first side of the routing layer, wherein the routing layer is electronically conductive;
a second dielectric over the second side of the laminate core;
a second routing layer over the second dielectric, wherein the second routing layer is electronically conductive;
a second cavity in the second dielectric and the second routing layer;
a third dielectric over the second routing layer;
a third routing layer over the third dielectric, wherein the third routing layer is electronically conductive; and
a third cavity in the third dielectric and the third routing layer, wherein the slug extends to the second cavity and the second side of the slug is exposed to the third cavity.

16. The apparatus of claim 1 wherein the plated element is electronically conductive.

17. The apparatus of claim 4 further comprising:
a third cavity in the second dielectric and the outer routing layer, wherein
a first portion of the plated element is positioned within the second cavity, and a second portion of the plated element is positioned within the third cavity such that the second side of the plated element is coplanar with a second side of the outer routing layer.

18. The system of claim 10 further comprising:
a second dielectric having a first side coupled with the second side of the routing layer and a second side opposite the first side of the second dielectric; and
an outer routing layer having a first side coupled with the second side of the second dielectric and a second side opposite the first side of the outer routing layer, wherein the outer routing layer is electronically conductive.

19. The system of claim 18 further comprising:
a third cavity in the second dielectric and the outer routing layer, wherein
the second side of the plated element is exposed to the third cavity.

* * * * *